US010768202B2

(12) United States Patent
Carpick et al.

(10) Patent No.: US 10,768,202 B2
(45) Date of Patent: Sep. 8, 2020

(54) SYSTEMS AND METHODS FOR NANO-TRIBOLOGICAL MANUFACTURING OF NANOSTRUCTURES (71) Applicant: THE TRUSTEES OF THE UNIVERSITY OF PENNSYLVANIA, Philadelphia, PA (US)

(72) Inventors: Robert W. Carpick, Philadelphia, PA (US); Harmandeep S. Khare, Philadelphia, PA (US); Nitya Nand Gosvami, Philadelphia, PA (US); Imene Lahouij, Philadelphia, PA (US)

(73) Assignee: THE TRUSTEES OF THE UNIVERSITY OF PENNSYLVANIA, Philadelphia, PA (US)

(*) Notice: Subject to any disclaimer, the term of this patent is extended or adjusted under 35 U.S.C. 154(b) by 0 days.

(21) Appl. No.: 15/747,183

(22) PCT Filed: Aug. 29, 2016

(86) PCT No.: PCT/US2016/049216
§ 371 (c)(1),
(2) Date: Jan. 24, 2018

(87) PCT Pub. No.: WO2017/044331
PCT Pub. Date: Mar. 16, 2017

(65) Prior Publication Data
US 2018/0210007 A1 Jul. 26, 2018

Related U.S. Application Data (60) Provisional application No. 62/215,545, filed on Sep. 8, 2015.

(51) Int. Cl.
G01Q 60/42 (2010.01)
G03F 7/00 (2006.01)
(Continued)

(52) U.S. Cl.
CPC .............. *G01Q 60/42* (2013.01); *B82Y 35/00* (2013.01); *G01Q 10/065* (2013.01); *G01Q 30/14* (2013.01);
(Continued)

(58) Field of Classification Search
CPC ...... G01Q 60/42; G01Q 30/14; G01Q 10/065; G01Q 80/00; G01Q 70/14; G01Q 60/26; G01Q 20/02; B82Y 35/00; G03F 7/0002
(Continued)

(56) References Cited

U.S. PATENT DOCUMENTS 5,922,214 A * 7/1999 Liu .................. B05D 1/185
216/2
6,828,033 B1 * 12/2004 Bancroft ................ C23C 22/03
428/469
(Continued)

FOREIGN PATENT DOCUMENTS

WO WO 2009/071674 A2 6/2009
WO WO 2009071674 A2 * 6/2009 ............... B24B 1/00
WO WO 2014/008121 A1 1/2014

OTHER PUBLICATIONS

International Search Report dated Nov. 7, 2016 in International Application No. PCT/US16/49216.

*Primary Examiner* — Michael Maskell
(74) *Attorney, Agent, or Firm* — Baker Botts L.L.P.

(57) ABSTRACT

The presently disclosed subject matter provides systems and methods for generating nanostructures from tribological films. A probe tip can be immersed in a liquid mixture comprising a plurality of ink particles suspended in a medium. A substrate on which the tribological film is to be generated can also be immersed in the liquid mixture. A processor controlling movement of the probe tip can be configured to cause the probe tip to slide along the substrate in a shape of a desired pattern of the nanostructure with a
(Continued)

contact force to cause one or more ink particles of the plurality of ink particles compressed underneath the probe tip to be transformed into a tribological film onto the substrate in the shape of the desired pattern of the nanostructure.

17 Claims, 8 Drawing Sheets

(51) Int. Cl.
*G01Q 30/14* (2010.01)
*B82Y 35/00* (2011.01)
*G01Q 10/06* (2010.01)
G01Q 60/26 (2010.01)
G01Q 70/14 (2010.01)
G01Q 80/00 (2010.01)
G01Q 20/02 (2010.01)

(52) U.S. Cl.
CPC ........... *G03F 7/0002* (2013.01); *G01Q 20/02* (2013.01); *G01Q 60/26* (2013.01); *G01Q 70/14* (2013.01); *G01Q 80/00* (2013.01)

(58) Field of Classification Search
USPC .............................................. 850/33, 62, 63
See application file for complete search history.

(56) References Cited

U.S. PATENT DOCUMENTS

| | | | |
|---|---|---|---|
| 7,887,885 B2 * | 2/2011 | Mirkin | B82B 3/00 |
| | | | 427/259 |
| 2003/0049381 A1 * | 3/2003 | Mirkin | B82B 3/00 |
| | | | 427/402 |
| 2009/0112957 A1 | 4/2009 | Abramovitch et al. | |
| 2009/0317172 A1 * | 12/2009 | Bedhome | B43K 1/003 |
| | | | 401/198 |
| 2011/0166045 A1 | 7/2011 | Dhawan et al. | |
| 2012/0167262 A1 | 6/2012 | Mirkin et al. | |

* cited by examiner

Topography
- Width changes with scan angle (tip asymmetry)
- Thickness increases with contact pressure (stress-activation).

1. Scanning perpendicular to the cantilever axis
2. Scanning parallel to the cantilever axis

SYSTEMS AND METHODS FOR NANO-TRIBOLOGICAL MANUFACTURING OF NANOSTRUCTURES

CROSS-REFERENCE TO RELATED APPLICATIONS

This application is a U.S. National Stage Patent Application under 35 U.S.C. § 371 of International Application No. PCT/US2016/049216, filed on Aug. 29, 2016, which claims priority to U.S. Provisional Application Ser. No. 62/215,545, filed on Sep. 8, 2015, the contents of which are incorporated by reference herein in their entirety.

GRANT INFORMATION

This invention was made with government support under grant number DE-SC0009222 awarded by the Department of Energy. The government has certain rights in the invention.

BACKGROUND

Conventional methods for manufacturing nanostructures with nanoscale precision such as dip-pen lithography and electron beam lithography require purpose-built lithography-only instruments and require various different custom built materials such as masks, resists, and patterns. Even with such conventional processes that require customized and expensive equipment, it is difficult to achieve molecular level precision in the generated nanostructures. Furthermore, imaging and characterizing such nanostructures often requires use of different equipment. There is a need for manufacturing and characterizing nanostructures built with nanometer scale precision in the same equipment.

SUMMARY

Systems and methods for generating nanostructures from tribological films are disclosed herein. In an example embodiment, a probe tip can be immersed in a liquid mixture comprising a plurality of ink particles suspended in a medium. A substrate on which the tribological film is to be generated can also be immersed in the liquid mixture.

A processor controlling movement of the probe tip can be configured to cause the probe tip to slide along the substrate in a shape of a desired pattern of the nanostructure with a contact force to cause one or more ink particles of the plurality of ink particles compressed underneath the probe tip to be transformed into a tribological film onto the substrate in the shape of the desired pattern of the nanostructure.

In some embodiments, the plurality of ink particles can include at least one of a plurality of nanoparticles and a plurality of molecules.

In some embodiments, the probe tip can be a tip of an atomic force microscopy probe. In some embodiments, the substrate can be a preexisting nanostructure and the tribological film deposited on the preexisting nanostructure can generate a complex multi-material nanostructured device.

In some embodiments, the processor can measure an amount of friction between the probe tip and the nanostructure simultaneously while manufacturing the nanostructure and determine a topography of each portion of the tribofilm associated with the nanostructure from the amount of friction measured between the probe tip and each portion of the tribofilm after that corresponding portion is deposited onto the substrate.

In some embodiments, an AFM cantilever can be connected to the probe tip. The position of the AFM cantilever can change according to a dimension of the tribofilm being manufactured directly under the probe tip. A laser beam source can emit a laser beam onto the AFM cantilever. A photodetector can capture laser beams reflected from the AFM cantilever. The processor can instruct the laser beam source to direct a laser beam onto an AFM cantilever and process the laser beam reflected off the AFM cantilever as the nanostructure is being manufactured to generate an image of the nanostructure by determining a position of the photodetector on which the laser beam reflected off the AFM cantilever is incident upon. The processor can maintain the position of the photodetector to be constant through use of a feedback loop that controls a vertical separation distance between the tribofilm and a cantilever hold of the probe tip.

In some embodiments, the thickness of the tribological film is controlled by a contact force with which the probe tip is brought into contact with the substrate and by varying an amount of time the probe tip is in contact with the substrate. In some embodiments, the width of a portion of the nanostructure can be varied by varying a scan angle with which the probe tip is being slid along the substrate. In some embodiments, nanostructures with single line widths within 10 nm to 100 nm can be generated by using probe tips of different sizes.

In some embodiments, the plurality of ink nanoparticles can be selected from the group consisting of zirconia nanoparticles, molybdenum dialkyldithiocarbamate (MoDTC) molecules, and zinc dialkyldithiophosphates (ZDDP) molecules.

The disclosed subject matter can have a wide variety of applications including creating nanostructured channels for fuel cells and MEMS/NEMS devices, wear resistant coatings, photonic lattices, and nanoscale sensors.

Throughout the drawings, the same reference numerals and characters, unless otherwise stated, are used to denote like features, elements, components or portions of the illustrated embodiments. Moreover, while the disclosed subject matter will now be described in detail with reference to the figures, it is done so in connection with the illustrative embodiments.

DETAILED DESCRIPTION OF EMBODIMENTS

The subject matter disclosed herein provides systems and methods for growing nanostructures using tribologically grown thin films. The techniques disclosed herein enable printing nanostructures with common atomic force microscope (AFM) tips and eliminates the need for custom nanolithography equipment.

In one embodiment with reference to FIG. 1, an exemplary system can include an AFM probe tip that generates tribological films such as tribofilm 110, hereinafter also referred to as tribofilms, on a substrate 107. The AFM probe 103 and portions of an AFM cantilever 104 connected to the probe 103 can be submerged in a fluid cell 108 containing a liquid mixture 101 of additive nanoinks dispersed in a media. The media can be either a polar or a non-polar solvent. The media can be selected based on the additive nanoink that is used to be well suited for tribological printing. In the example shown in FIG. 1, the media of mixture 101 is a base oil. In the example show in FIG. 1, the additive nanoink is ZDDP 109. Tribological thin films can be created when the AFM tip is placed in contact with the substrate immersed in the liquid mixture.

The additives (i.e., molecules and/or nanoparticles) in the media of the liquid mixture 101 can become trapped in between the tip of probe 103 and the substrate 107. The pressure applied by the AFM probe 103's tip on the substrate 107 can cause the additives in the liquid mixture 101 to form a solidified product (i.e. a tribofilm) 110 that is bound to the substrate 107. In some embodiments, the tribofilm 110 can be generated when the liquid mixture 101 as well as the substrate 107 is heated using heater 102. Additionally or alternatively, similar tribofilms can be generated by using thermal AFM probes in which a current can be applied through an AFM cantilever with a resistive heater at the end of the cantilever. Locally heating the AFM probe in this manner, while the liquid and the substrate as a whole remain at ambient temperature, temperature increase can occur within the highly localized contact area. When a suitable force is applied by the AFM probe 103's tip on the surface of the substrate 107 while the AFM probe 103's tip is sliding on the surface of the substrate 107 according to a predefined scan pattern and/or trajectory, the material deposition of the additive can occur either physically or through a chemical reaction only within the contact region of the AFM probe 103's tip and the substrate surface (i.e., due to tribological action). A processor that is programmed to generate a particular nanostructure using a predefined pattern can apply the suitable contact force to the AFM probe tip as the AFM probe tip is moving through the appropriate region of the substrate on which the tribofilm of a desired thickness is to be formed. In some embodiments, an AFM processor can instruct the AFM probe 103 to apply a preset force to generate a desired pattern in a nanostructure. In another embodiment, the desired pattern of the nanostructure can be generated by the AFM probe 103 using variable contact forces. For example, the contact force applied by the AFM probe 103's tip can be varied by the processor for different portions of the pattern to create portions of the nanostructure having different out-of-plane thickness.

In some embodiments, an AFM processor can maintain a vertical separation distance between the tribological and/or the substrate film and the probe tip. For example, the AFM processor can use the last measured height of the tribofilm 110 to determine a new vertical position for the AFM probe 103's tip and/or the AFM cantilever 104 connected to the probe tip in order to maintain a vertical separation distance between the probe 103's tip and the triobofilm 110 underneath it. The processor can instruct the AFM cantilever 104 connected to the AFM probe 103's tip to adjust the position of the cantilever 104 and/or the probe 103's tip. In some embodiments, the AFM processor can also maintain the position of the photodetector 106 at which the laser beam 105 reflected off the AFM cantilever 104 is incident upon to be constant using the feedback loop described above that controls the vertical separation distance between the tribofilm 110 and the cantilever hold of the AFM probe 103's tip.

In some embodiments, the surface characteristics of the generated tribofilm nanostructures can be measured intermittently with respect to the generation of the nanostructure. The same AFM that is used to generate the tribofilm 110 can characterize the topography of the tribofilm 110 immediately after a given portion of the tribofilm 110 is being generated. For example, as the tribofilm 110 forms due to the solidification of the additives in the liquid mixture 101 on the substrate, the vertical position of the AFM probe 103's tip that is scanning the tribofilm surface through contact with the tribofilm surface is accordingly shifted due to the feature height of the tribofilm underneath. Such a shift in probe tip height causes the AFM cantilever 104 connected to the probe 103 to also change its position vertically. While the AFM is scanning the surface of the substrate 107, a laser beam is directed onto the AFM cantilever 104. The laser beam 105 that is reflected off of the surface of the AFM cantilever 104 is collected by a photodetector 106 and is used to measure the position of the AFM cantilever 104 and therefore the probe 103's tip. In this manner, the surface height of probe 103's tip is measured and thus the topography of a portion of the generated tribofilm 110 is determined immediately after that portion of the tribofilm 110 is created and while another portion of the nanostructure is being generated. In this manner, the surface topography of a portion of the nanostructure can be calculated intermittently while another portion of the nanostructure is being generated.

In some embodiments, the AFM probe 103's tip can also be used to measure the surface roughness and rigidity of the tribofilm 110 that is generated on the surface of the substrate 107. For example, the AFM probe can measure the friction between the probe 103's tip and a portion of the tribofilm 110 generated underneath the probe 103's tip simultaneously while generating that corresponding portion of the tribofilm 110. By calculating the amount of measured friction between the probe 103's tip and the surface of a given portion of the tribofilm 110, surface characteristics of that corresponding portion of the tribofilm 110 (e.g., surface roughness) can be determined.

In one embodiment, nanocrystalline zirconia nanoparticles can be used. In another embodiment, molybdenum dialkyldithiocarbamate (MoDTC) molecules can be used as the additive. In yet another embodiment, zinc dialkyldithiophosphates (ZDDP) molecules can be used be as the additive in the liquid mixture 101. Applications for zirconia nanopatterns include nanostructured solid-oxide fuel cells, nanophotonics, and optical and thermal barrier layers. Applications for ZDDP based nanostructures include anti-wear coatings for silicon based devices (e.g., MEMS/NEMS) or as dielectric features in electronic devices. Molecular additives such as MoDTC and ZDDP can be directly dissolved and remain suspended in the media. However, nanoparticle based additives (i.e. zirconia nanoparticles) can be chemically functionalized to remain dispersed in the media of the liquid mixture in order for them to be trapped under the AFM probe tip to solidify into tribofilms. In some embodiments, various substrates including a variety of steels, aluminum oxide and silicon can be used as substrates on which tribofilms are generated. Additional example of applications for such precisely generated nanostructures can include biosensors, data storage devices and other nanoscale devices.

In some embodiments, the width and height of the deposited tribofilm 110 can be controlled. For example, by varying the diameter and/or size of the probe 103's tip, the width of the resulting tribofilm 110 formed by additives solidifying under the probe 103 can be varied. Additionally or alternatively, the thickness of the generated tribofilm 110 can be increased by increasing the contact pressure applied by the AFM probe 103 to the substrate 107. Additionally or alternatively, the thickness of the generated tribofilm 110 can be increased by increasing the amount of time the probe 103 spends in contact with the same region of the substrate 107. In some embodiments, the width of the generated tribofilm 110 can be controlled by varying the scan angle. Since the AFM probe 103's tip can be asymmetrical in shape, the amount of surface area of the probe 103 exposed to the substrate 107 can be varied by varying the scan angle with which the probe 103's tip contacts the substrate 107, resulting in control over the width of the generated tribofilm 110.

Figure 1:
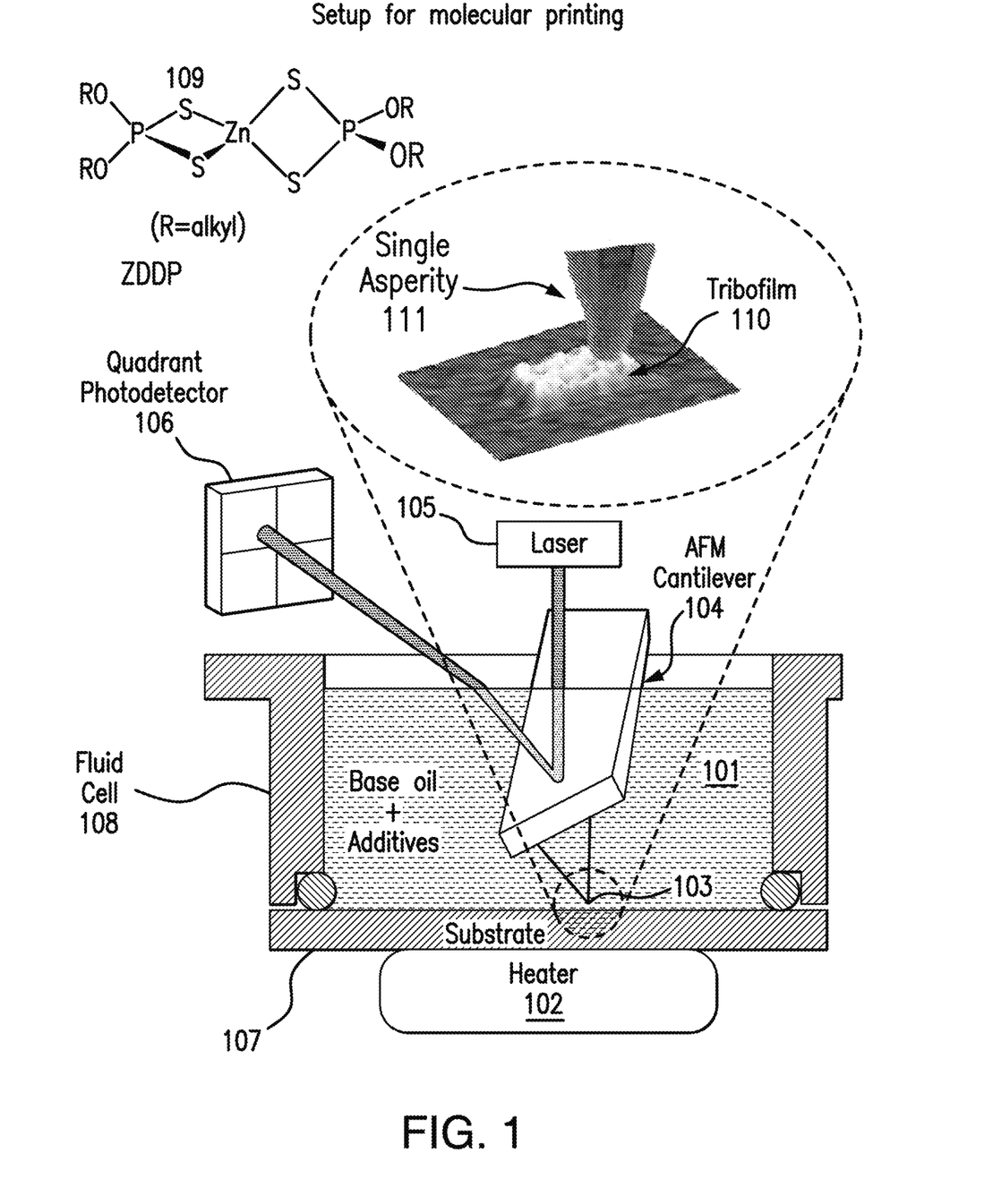
FIG. 1 shows an exemplary system diagram for printing nanostructures using molecular inks in accordance with the disclosed subject matter.
Figure 2:
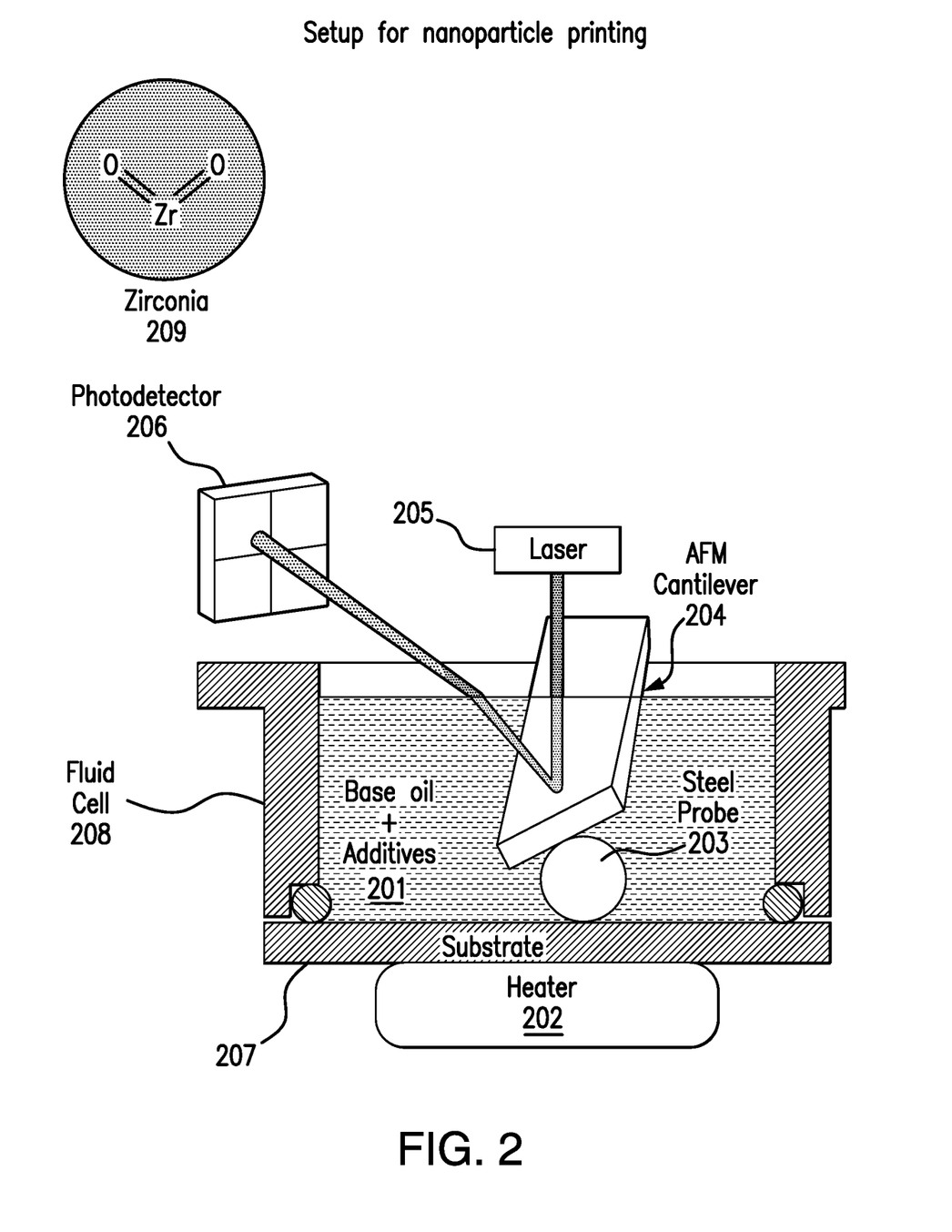
FIG. 2 shows an exemplary system diagram for printing nanostructures using nanoparticle based inks in accordance with the disclosed subject matter.

In some embodiments, a probe 103 with a pointed tip can be used for tribological printing of nanostructures using molecular additives as shown in FIG. 1. As shown in FIG. 2, a spherical probe 203 can be used instead of a pointed probe tip for printing nanostructures using nanoparticle additives.

In the embodiment shown in FIG. 2, the spherical AFM probe 203 and portions of an AFM cantilever 204 connected to the probe 203 can be submerged in a fluid cell 208 containing a liquid mixture 201 of additive nanoinks dispersed in a media. The media can be either a polar or a non-polar solvent. The media can be selected based on the additive nanoink that is used to be well suited for tribological printing. In the example shown in FIG. 2, the media of mixture 201 is a base oil. In the example show in FIG. 2, the additive nanoink are zirconia nanoparticles 209. Tribological thin films can be created when the AFM probe 203 is placed in contact with the substrate 207 immersed in the liquid mixture 201.

Figure 3:
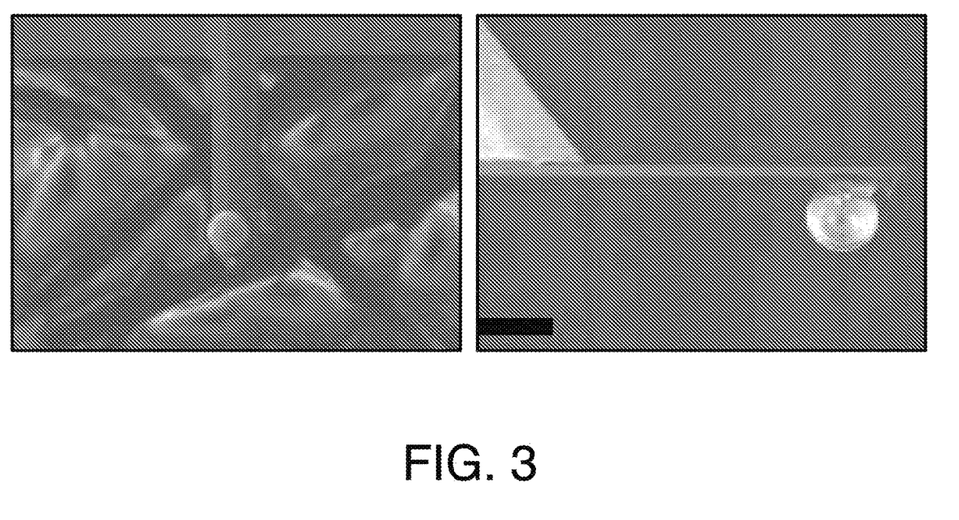
FIG. 3 shows an image of an example atomic force microscope (AFM) probe tip used for printing nanostructures in accordance with the disclosed subject matter.

The zirconia additives 209 in the media of the liquid mixture 201 can become trapped in under the spherical probe 203 and the substrate 207. The pressure applied by the AFM probe 203 on the substrate 207 can cause the zirconia additives 209 in the liquid mixture 201 to form a solidified product (i.e. a tribofilm) that is bound to the substrate 207. In some embodiments, the tribofilm can be generated when the liquid mixture 201 as well as the substrate 207 is heated using heater 202. Additionally or alternatively, similar tribofilms can be generated by using thermal AFM probes in which a current can be applied through an AFM cantilever with a resistive heater at the end of the cantilever. Locally heating the AFM probe in this manner, while the liquid and the substrate as a whole remain at ambient temperature, temperature increase can occur within the highly localized contact area. When a suitable force is applied by the AFM probe 203 on the surface of the substrate 207 while the AFM probe 203 is rolling on the surface of the substrate 207 according to a predefined scan pattern and/or trajectory, the material deposition of the additive can occur either physically or through a chemical reaction only within the contact region of the AFM probe 203 and the substrate surface (i.e., due to tribological action). A processor that is programmed to generate a particular nanostructure using a predefined pattern can apply the suitable contact force to the AFM probe 203 as the AFM probe 203 is moving through the appropriate region of the substrate on which the tribofilm of a desired thickness is to be formed. In some embodiments, an AFM processor can instruct the AFM probe 203 to apply a preset force to generate a desired pattern in a nanostructure. In another embodiment, the desired pattern of the nanostructure can be generated by the AFM probe 203 using variable contact forces. For example, the contact force applied by the AFM probe 203 can be varied by the processor for different portions of the pattern to create portions of the nanostructure having different out-of-plane thickness. As described above with relation to FIG. 1, measurements of the generated tribofilm can be recorded by capturing, at photodector 206, the reflections of the laser 205 that reflects off of the surface of the AFM cantilever 206 and processing such data using the AFM processor. FIG. 3 depicts scanning electron microscopy images of the AFM probe tip that is used for tribological printing of nanostructures. The AFM probe tips shown in FIG. 3 is an example of the probe tip used to perform the processes described by the disclosed subject matter.

Figure 4:
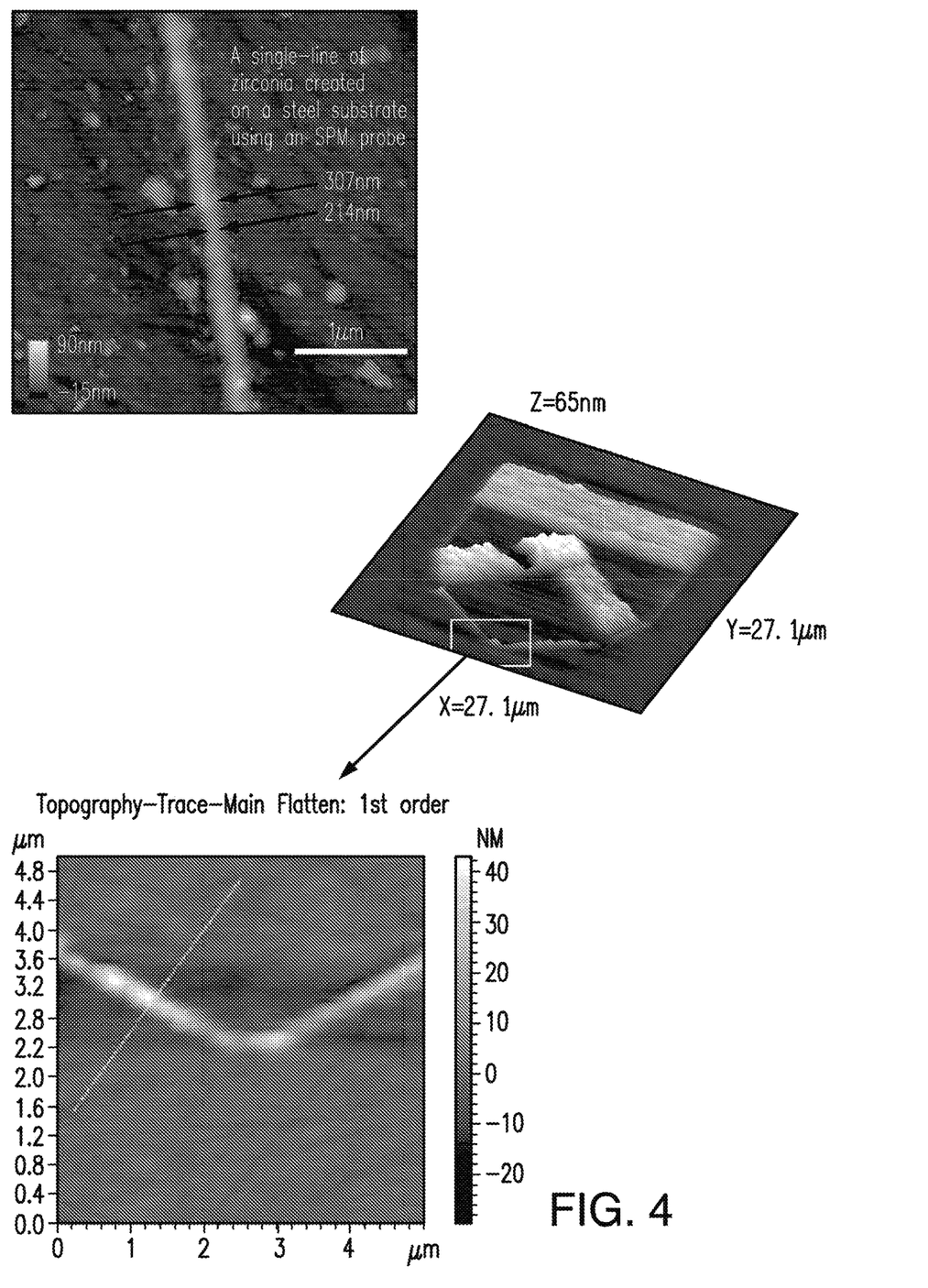
FIG. 4 shows an exemplary image of a nanostructure and characterization results of the nanostructure in accordance with the disclosed subject matter.

FIG. 4 shows an exemplary image of a nanostructure resembling a logo of the "University of Pennsylvania" and characterization results of the nanostructure. To create such a nanostructure, a predefined pattern with desired parameters (e.g., three dimensional size parameters) can be inputted into a processor of the system of the disclosed subject matter. Such a shape may be received by the processor from an input source. Upon determining which additives and the shape and size of the probe, the processor can determine a scan pattern scheme with which the probe is to be slid throughout the surface of the substrate. The processor can also calculate the amount of time that the probe is to be maintained and the force to be applied at each portion of the pattern in order to generate the desired thickness of the tribofilm in that corresponding region according to the dimensions of the input pattern. In another embodiment, a pattern and the amount of time that the probe is to be applied over each portion of the pattern, and the force to be applied by the probe at each portion of the pattern, can be manually input and/or programmed for the AFM processor to use. Additionally or alternatively, the processor can calculate the scan angle with which the probe tip is to be applied to different portions of the substrate to generate the desired width of the nanostructure for a corresponding region of the pattern. As shown in the characterization results of the exemplary pattern (i.e., the "University of Pennsylvania" logo) in FIG. 4, by using zirconia based oil "ink" at room temperature, features below 100 nm were obtained in the nanostructure.

Figure 5:
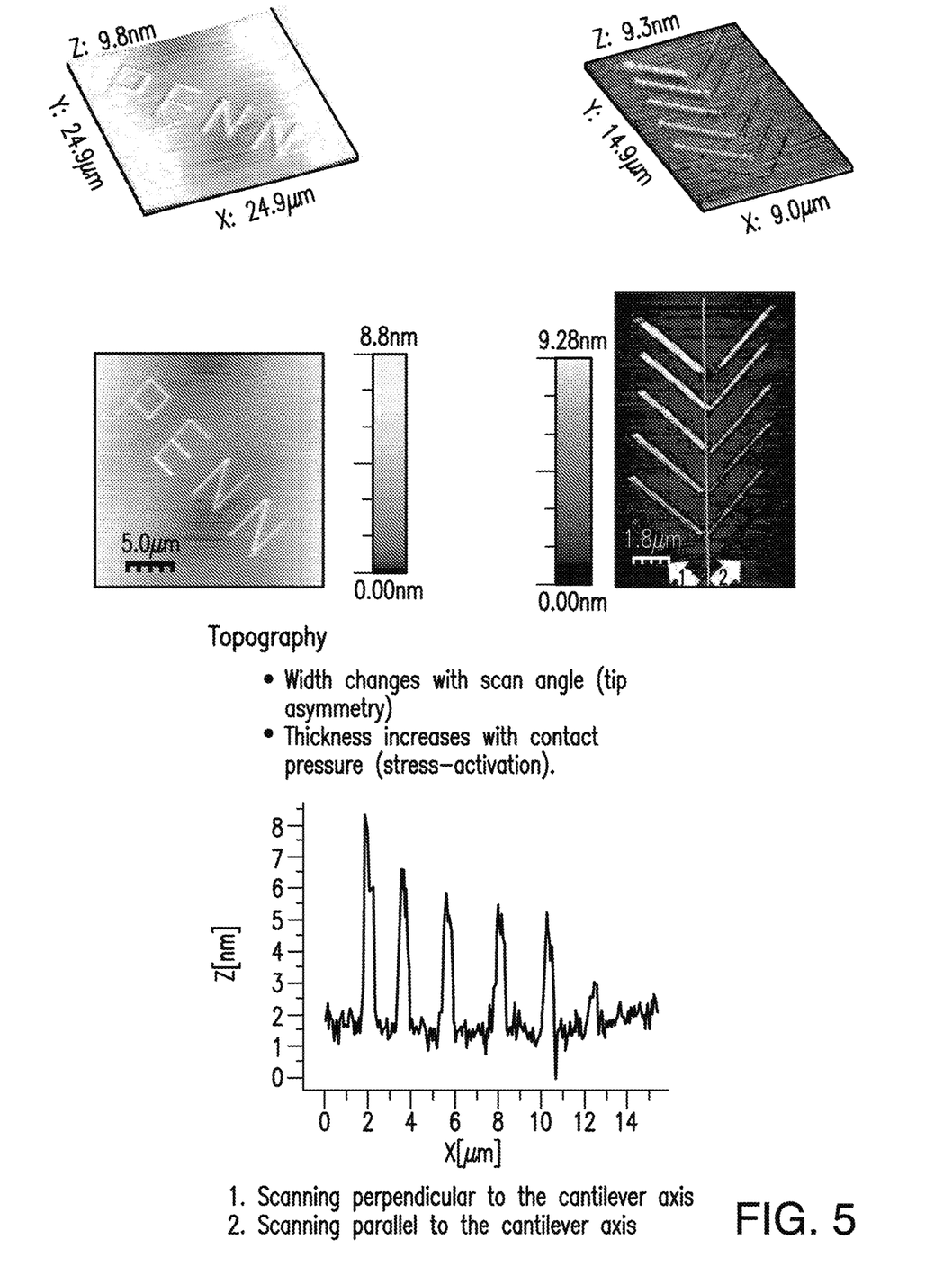
FIG. 5 shows an alternative exemplary image of a nanostructure and characterization results of the nanostructure in accordance with the disclosed subject matter.

In some embodiments, precise features (e.g., around 10 nm of out of plane thickness) can be generated using the systems and methods disclosed in the disclosed subject matter as seen from the nanostructure and characterization results of the nanostructure in FIG. 5.

Figure 6:
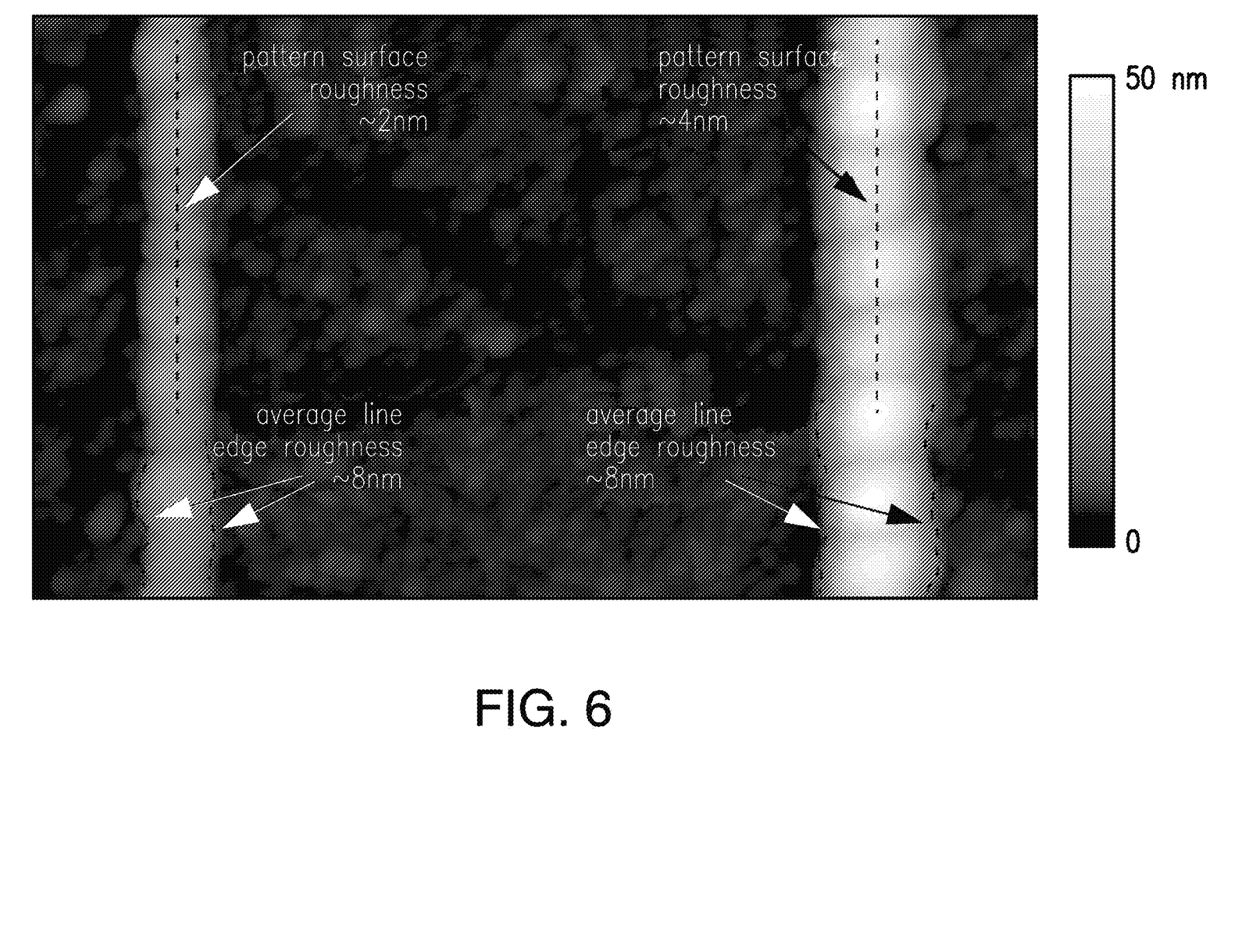
FIG. 6 shows an exemplary image of a tribological film generated in accordance with the disclosed subject matter using an AFM probe with varying surface height.

FIG. 6 shows an exemplary image of a tribological film generated using the same AFM probe with varying surface height. The two representative lines shown in FIG. 6 demonstrate the ability of the disclosed systems and methods to vary pattern height using the same probe by changing the normal load in an AFM. The annotated surface roughness of the lines and the line-edge ("sidewall") roughness demonstrates that lines can be patterned with fairly small surface and edge roughness (e.g., surface roughness is <10% of the line thickness).

Figure 7:
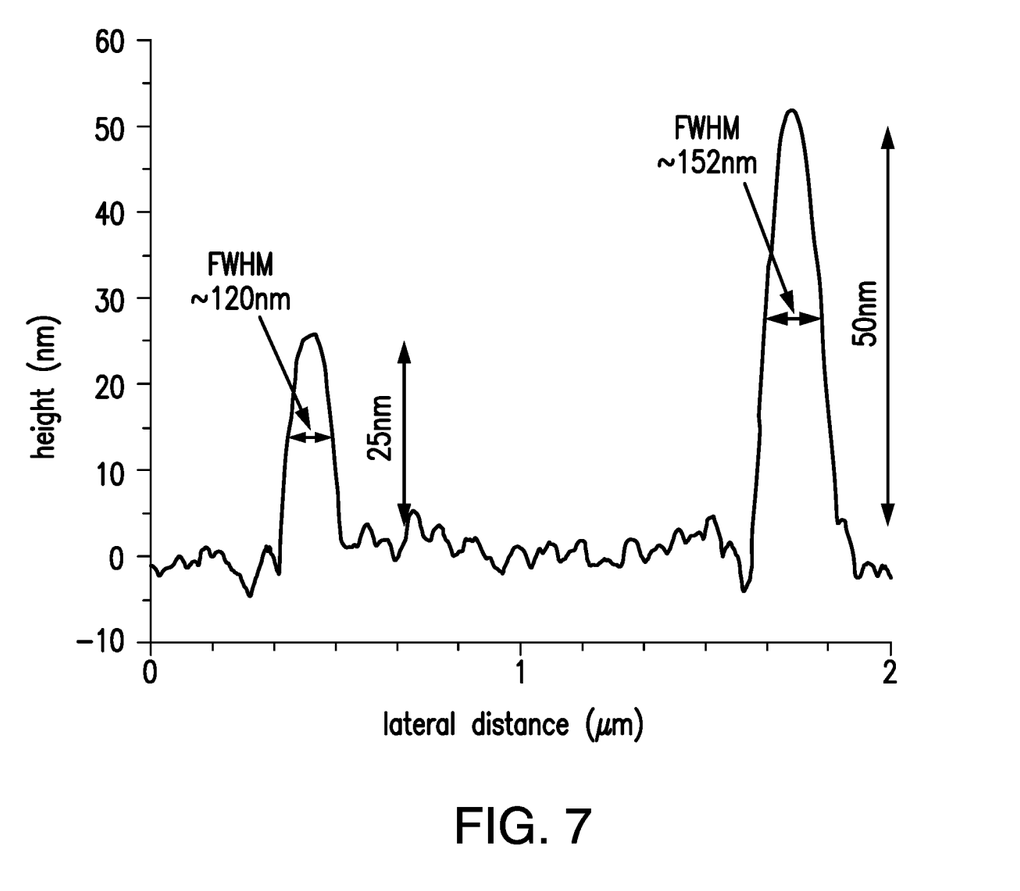
FIG. 7 shows a graph illustrating the surface thickness of the tribological film of FIG. 6.

FIG. 7 shows a graph detailing the surface thickness of the tribological film of FIG. 6. In particular, FIG. 7 shows a representative cross-section through two patterns of FIG. 6, showing the thickness of patterned lines and the corresponding full width half maximum (FWHM) widths of such patterned lines.

The disclosed systems and methods can be used to generate nanostructures having patterns with nanoscale resolution in a single-step process, without the need for masks, resists, or patterns (as in photolithography, etc.). The large stresses applied by the AFM probe tip can help ensure that the patterned tribofilm is strongly anchored to the substrate and possesses significant mechanical and structural robustness.

In some embodiments, the systems and methods of the disclosed subject matter can be operated in parallel. For example, an array of calibrated AFM probes can be used to simultaneously print multiple patterns. Nanoscale printing and imaging of printed features of multiple different patterns and complex structures can be performed with nanoscale resolution simultaneously without the need for pattern or probe transfer. In some embodiments, complex structures can be built by nanotribologically printing nanostructures on previously existing nanostructures. For example, the disclosed systems and methods can be coupled with AFM-based manipulation of nanomaterials to couple the written patterns with species such as nanotubes and nanowires for complex, multi-material nanostructured devices.

In some embodiments, the solidified nanostructures that can be formed using the disclosed subject matter obtained cannot be formed by other means (i.e., without tribological action), and can have mechanical properties far better than those obtained using certain conventional 3D printing methods.

In some embodiments, applications of the disclosed subject matter can include creating nanostructured electrolytic channels for micro-solid oxide fuel cells (e.g., by nanotribologically printing with YSZ or zirconia nanoparticles), creating wear-resistant coatings for MEMS/NEMS devices (e.g., by printing with ZDDP, zirconia or other dispersed particles). Additional applications of the disclosed subject may include creating nanostructured channels with conductive or semi-conductor materials for MEMS/NEMS devices, creating thermal barrier coatings using ceramic oxide or other materials, creating photonic lattices and materials for plasmonic applications, generating next-generation electronic transistors and associated devices, and creating nanoscale sensors for biological and chemical detection.

The foregoing merely illustrates the principles of the disclosed subject matter. Various modifications and alterations to the described embodiments will be apparent to those skilled in the art in view of the teachings herein. It will thus be appreciated that those skilled in the art will be able to devise numerous techniques which, although not explicitly described herein, embody the principles of the disclosed subject matter and are thus within its spirit and scope.

What is claimed is:

1. A method of generating a nanostructure on a substrate, comprising:
 a. immersing the substrate and a probe tip in a liquid mixture comprising ink particles suspended in a medium;
 b. sliding the probe tip along the substrate in a shape of a desired pattern of the nanostructure with a contact force;
 c. compressing one or more of the ink particles underneath the probe tip onto the substrate with a pressure sufficient to transform the one or more of the ink particles into a tribological film onto the substrate, thereby generating the nanostructure.

2. The method of claim 1, wherein the ink particles comprise nanoparticles and/or molecules.

3. The method of claim 1, wherein the probe tip comprises a tip of an atomic force microscopy probe.

4. The method of claim 1, wherein the substrate comprises a preexisting nanostructure, and wherein the tribological film deposited on the preexisting nanostructure generates a multi-material nanostructured device.

5. The method of claim 1, further comprising:
 measuring an amount of friction between the probe tip and the nanostructure simultaneously while manufacturing the nanostructure; and
 determining a topography of a portion of the tribological film associated with the nanostructure from the amount of friction measured between the probe tip and the portion of the tribological film after the portion is deposited onto the substrate.

6. The method of claim 1, further comprising capturing an image of the nanostructure while generating the nanostructure by:
 directing a laser beam onto an atomic force microscopy cantilever connected to the probe tip, wherein the position of the atomic force microscopy cantilever changes according to a dimension of the tribological film being manufactured directly under the probe tip
 capturing, on a photodetector, the laser beam reflected off the atomic force microscopy cantilever;
 generating an image of the nanostructure by determining a position of the photodetector on which the laser beam reflected off the atomic force microscopy cantilever is incident upon; and
 maintaining the position of the photodetector to be constant through use of a feedback loop that controls a vertical separation distance between the tribological film and a cantilever hold of the probe tip.

7. The method of claim 1, wherein a thickness of the tribological film is controlled by the contact force with which the probe tip compresses the one or more ink particles onto the substrate and by varying an amount of time the probe tip is in contact with the substrate.

8. The method of claim 1, wherein a width of a portion of the nanostructure is controlled by varying a scan angle with which the probe tip is being slid along the substrate.

9. The method of claim 1, wherein the generated nanostructure comprises a single line having a width within 10 nm to 100 nm.

10. The method of claim 1, wherein the ink nanoparticles are selected from the group consisting of zirconia nanoparticles, molybdenum dialkyldithiocarbamate (MoDTC) molecules, and zinc dialkyldithiophosphates (ZDDP) molecules.

11. A system for generating a nanostructure on a substrate immersed in a liquid mixture including ink particles suspended in a medium, comprising:
 a probe tip;
 a fluid cell adapted to hold the liquid mixture in fluidic contact with a first side of the substrate; and
 a processor, coupled to the probe tip and configured to cause the probe tip to slide along the substrate with a contact force to cause one or more of the ink particles to be compressed underneath the probe tip with a pressure sufficient to cause the one or more ink particles to be transformed into a tribological film onto the substrate, thereby generating the nanostructure.

12. The system of claim 11, wherein the ink particles comprise nanoparticles and/or molecules.

13. The system of claim 11, wherein the probe tip comprises a tip of an atomic force microscopy probe.

14. The system of claim 11, wherein the substrate comprises a preexisting nanostructure and wherein the tribological film deposited on the preexisting nanostructure generates a multi-material nanostructured device.

15. The system of claim 11, wherein the processor is further configured to:
measure an amount of friction between the probe tip and the nanostructure while generating the nanostructure; and
determine a topography of each portion of the tribological film associated with the nanostructure from the amount of friction measured between the probe tip and each portion of the tribological film after that corresponding portion is deposited onto the substrate.

16. The system of claim 11, further comprising:
an atomic force microscopy cantilever connected to the probe tip, wherein a vertical position of the atomic force microscopy cantilever changes according to a dimension of the tribological film being manufactured directly under the probe tip;
a laser beam source configured to emit a laser beam onto the atomic force microscopy cantilever;
a photodetector configured to capture laser beams reflected from the atomic force microscopy cantilever; and
wherein the processor is further configured to:
instruct the laser beam source to direct a laser beam onto an atomic force microscopy cantilever;
process the laser beam reflected off the atomic force microscopy cantilever as the nanostructure is being manufactured to generate an image of the nanostructure by determining a position of the photodetector on which the laser beam reflected off the atomic force microscopy cantilever is incident upon; and
maintain the position of the photodetector to be constant through use of a feedback loop that controls a vertical separation distance between the tribological film and a cantilever hold of the probe tip.

17. The system of claim 11, wherein the ink nanoparticles are selected from the group consisting of zirconia nanoparticles, molybdenum dialkyldithiocarbamate (MoDTC) molecules, and zinc dialkyldithiophosphates (ZDDP) molecules.

* * * * *